United States Patent
Uemura

(10) Patent No.: US 10,298,115 B2
(45) Date of Patent: May 21, 2019

(54) SEMICONDUCTOR DEVICE

(71) Applicant: MITSUBISHI ELECTRIC CORPORATION, Tokyo (JP)

(72) Inventor: Hitoshi Uemura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 398 days.

(21) Appl. No.: 15/305,872

(22) PCT Filed: Sep. 11, 2014

(86) PCT No.: PCT/JP2014/074086
§ 371 (c)(1),
(2) Date: Oct. 21, 2016

(87) PCT Pub. No.: WO2016/038721
PCT Pub. Date: Mar. 17, 2016

(65) Prior Publication Data
US 2017/0054360 A1 Feb. 23, 2017

(51) Int. Cl.
*H02H 3/00* (2006.01)
*H02M 1/32* (2007.01)
(Continued)

(52) U.S. Cl.
CPC .......... *H02M 1/32* (2013.01); *H01L 29/1608* (2013.01); *H01L 29/872* (2013.01);
(Continued)

(58) Field of Classification Search
CPC ...................................... H02M 1/32
See application file for complete search history.

(56) References Cited

U.S. PATENT DOCUMENTS 5,077,651 A * 12/1991 Kobayashi .............. H02M 1/34
363/132
5,629,542 A * 5/1997 Sakamoto ........... H01L 27/0629
257/146
(Continued)

FOREIGN PATENT DOCUMENTS

CN         102290969 A      12/2011
JP        2000-092817 A      3/2000
(Continued)

OTHER PUBLICATIONS

International Search Report issued in PCT/JP2014/074086; dated Dec. 2, 2014.
(Continued)

*Primary Examiner* — Stephen W Jackson
(74) *Attorney, Agent, or Firm* — Studebaker & Brackett PC

(57) ABSTRACT

A semiconductor device includes self-arc-extinguishing elements and a clamp circuit. Each of the self-arc-extinguishing elements has a control terminal and main electrode terminals. The clamp circuit clamps, at the time of turnoff of one of the self-arc-extinguishing elements, the voltage between the main electrode terminals of the self-arc-extinguishing element at a clamp voltage set equal to or lower than 70% of a static withstand voltage that the self-arc-extinguishing element has. The self-arc-extinguishing elements are connected in series with each other. The clamp circuit may be provided between the control terminal and the main electrode terminal of the self-arc-extinguishing elements. The clamp circuit may include a circuit formed by connecting Zener diodes in series such that an anode of one of the Zener diodes is connected to a cathode of another Zener diode.

7 Claims, 12 Drawing Sheets

(51) Int. Cl.
  *H02M 1/00* (2006.01)
  *H02M 7/48* (2007.01)
  *H01L 29/16* (2006.01)
  *H01L 29/872* (2006.01)
  *H02H 7/122* (2006.01)
  *H02M 7/487* (2007.01)
  *H02M 7/5387* (2007.01)
  *H01L 25/18* (2006.01)
  *H01L 27/02* (2006.01)

(52) U.S. Cl.
  CPC ............ *H02H 7/1225* (2013.01); *H02M 1/00* (2013.01); *H02M 7/48* (2013.01); *H02M 7/487* (2013.01); *H02M 7/5387* (2013.01); *H01L 25/18* (2013.01); *H01L 27/0255* (2013.01)

(56) References Cited

U.S. PATENT DOCUMENTS

| | | | | |
|---|---|---|---|---|
| 6,188,589 B1* | 2/2001 | Okayama | ................ | H02M 1/34 363/136 |
| 6,304,475 B1* | 10/2001 | Iwata | .................... | H01S 3/0975 363/132 |
| 9,887,617 B2* | 2/2018 | Hasegawa | ............. | H02M 7/487 |
| 9,941,255 B2* | 4/2018 | Nakashima | ........... | H01L 23/049 |

FOREIGN PATENT DOCUMENTS

| | | |
|---|---|---|
| JP | 2002-151989 A | 5/2002 |
| JP | 2004-140891 A | 5/2004 |
| JP | 2009-253484 A | 10/2009 |
| JP | 2011-024382 A | 2/2011 |
| JP | 2013-074634 A | 4/2013 |

OTHER PUBLICATIONS

An Office Action mailed by the State Intellectual Property Office of the People's Republic of China dated Nov. 2, 2018, which corresponds to Chinese Patent Application No. 201480081885.0 and is related to U.S. Appl. No. 15/305,872; with English translation.

Notification of Transmittal of Translation of the International Preliminary Report on Patentability (Chapter I) and Translation of Written Opinion of the International Searching Authority; PCT/JP2014/074086; dated Mar. 23, 2017.

* cited by examiner

SEMICONDUCTOR DEVICE

FIELD

The present invention relates to a semiconductor device.

BACKGROUND

Conventionally, the mainstream of semiconductor elements used in power converters was pressure-contact semiconductors such as GTO thyristors and GCTs. In recent years, however, self-arc-extinguishing elements such as IGBTs have become mainstream and there have been an increasing number of instances of use of a plurality of self-arc-extinguishing elements connected in series. For example, a technique of forming one arm by connecting a plurality of self-arc-extinguishing elements in series is known. The self-arc-extinguishing elements, e.g., IGBTs have a switching speed higher than those of the above-mentioned pressure-contact semiconductors. There is a problem that when the arm is turned off, an overvoltage is applied to a particular one or ones of the semiconductor elements if a voltage is not evenly applied to the self-arc-extinguishing elements constituting the arm. Regarding this, a technique disclosed in Patent Literature 1 shown below (JP 2004-140891 A) may be mentioned, which is a technique to protect a semiconductor element by clamping an overvoltage applied to main electrodes of the semiconductor element.

CITATION LIST

Patent Literature

[PTL 1] JP 2004-140891 A

SUMMARY

Technical Problem

A finding from a study earnestly made by the inventor of the present invention shows that after turnoff, voltage unbalance can occur between a plurality of self-arc-extinguishing elements connected in series. There is a problem that due to this voltage unbalance a high voltage is applied to part of the self-arc-extinguishing elements such that there is a possibility of the voltage exceeding the static withstand voltage of the semiconductor. The protective circuit according to Patent Literature 1 is solely for protecting the semiconductor element when an overvoltage is applied, and does not operate when no overvoltage is generated. Voltage unbalance found by the inventor of the present invention is a phenomenon different from overvoltage considered in the related art. Therefore such voltage unbalance cannot be inhibited by the conventional protective circuit.

The present invention has been accomplished to solve the above-described problem, and an object of the present invention is to provide a semiconductor device capable of inhibiting voltage unbalance between a plurality of semiconductor elements after turnoff.

Solution to Problem

A semiconductor device includes: a plurality of first self-arc-extinguishing elements having a control terminal and a plurality of main electrode terminals, the first self-arc-extinguishing elements being connected in series with each other; and clamp means connected to the plurality of first self-arc-extinguishing elements, the clamp means clamping, at the time of turnoff of one of the first self-arc-extinguishing elements, the voltage between the main electrode terminals of the first self-arc-extinguishing element at a clamp voltage set equal to or lower than 70% of a static withstand voltage that the first self-arc-extinguishing element has.

Advantageous Effects of Invention

According to the present invention, the voltages between the main electrode terminals of the self-arc-extinguishing elements are intentionally clamped at a level sufficiently lower than the static withstand voltage, thus enabling inhibition of voltage unbalance between the plurality of self-arc-extinguishing elements.

DESCRIPTION OF EMBODIMENTS

Embodiment 1

Figure 1:
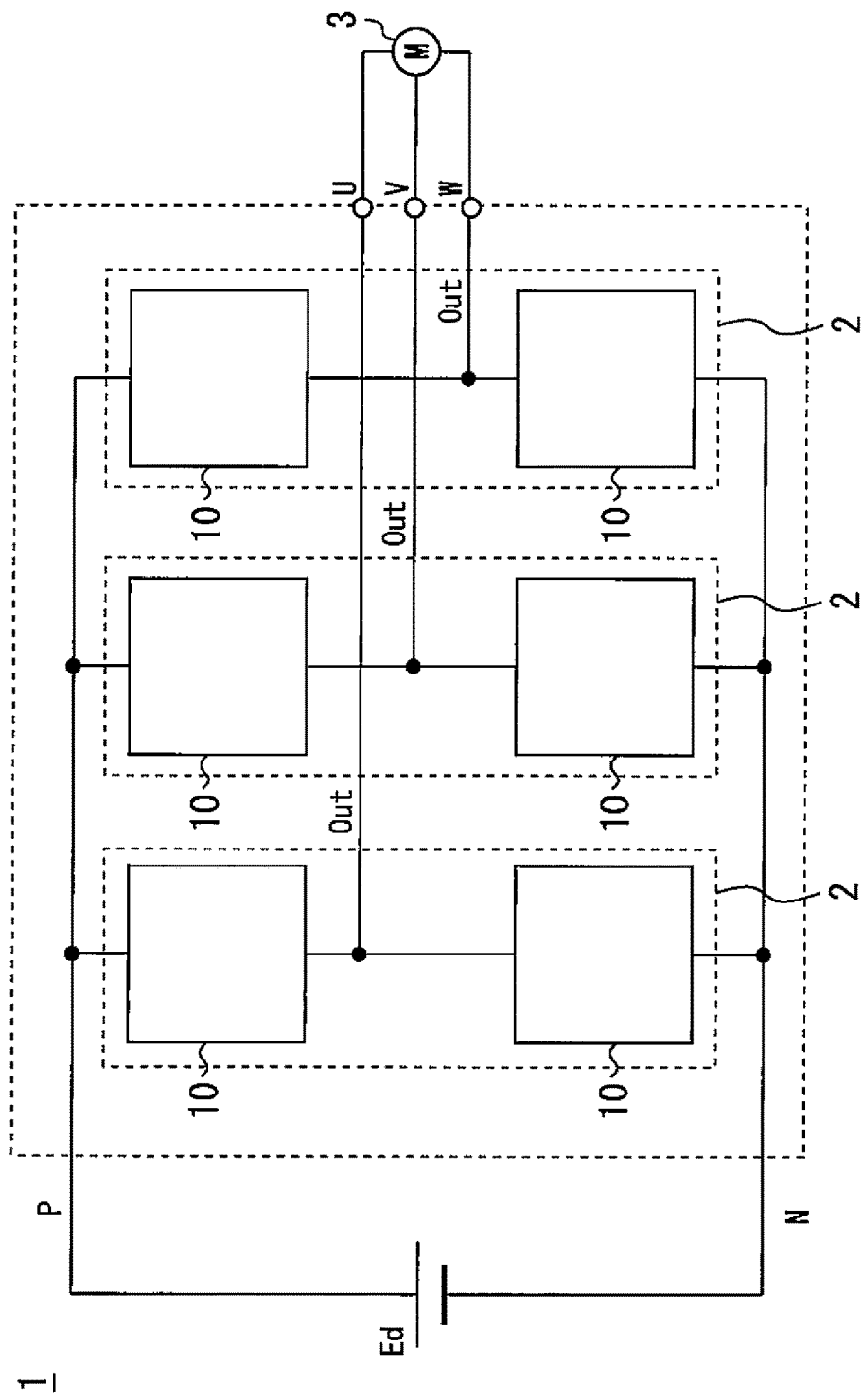
FIG. 1 is a diagram showing a semiconductor device according to Embodiment 1 of the present invention.
Figure 2:
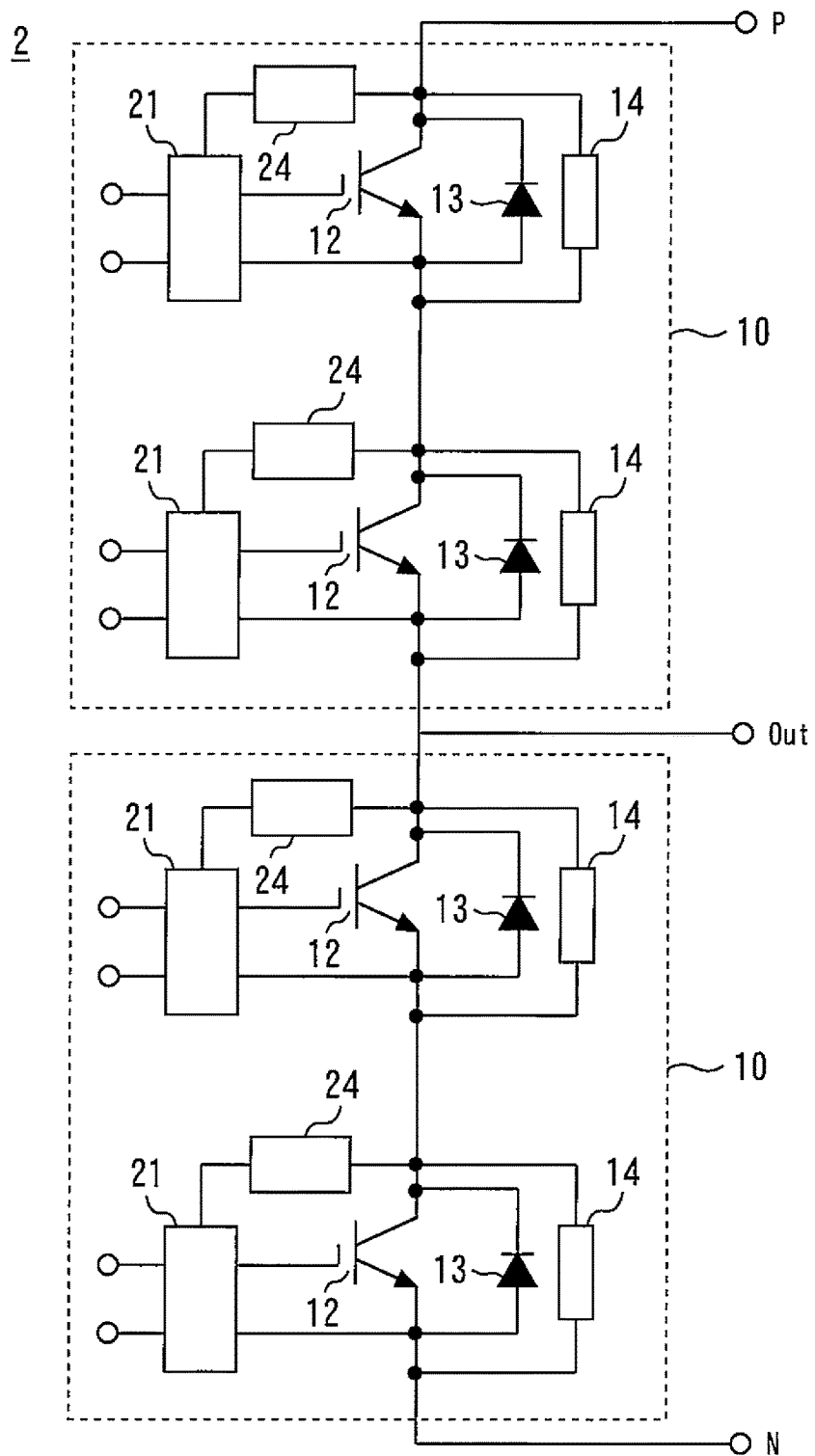
FIG. 2 is a diagram showing a semiconductor device according to Embodiment 1 of the present invention.
Figure 3:
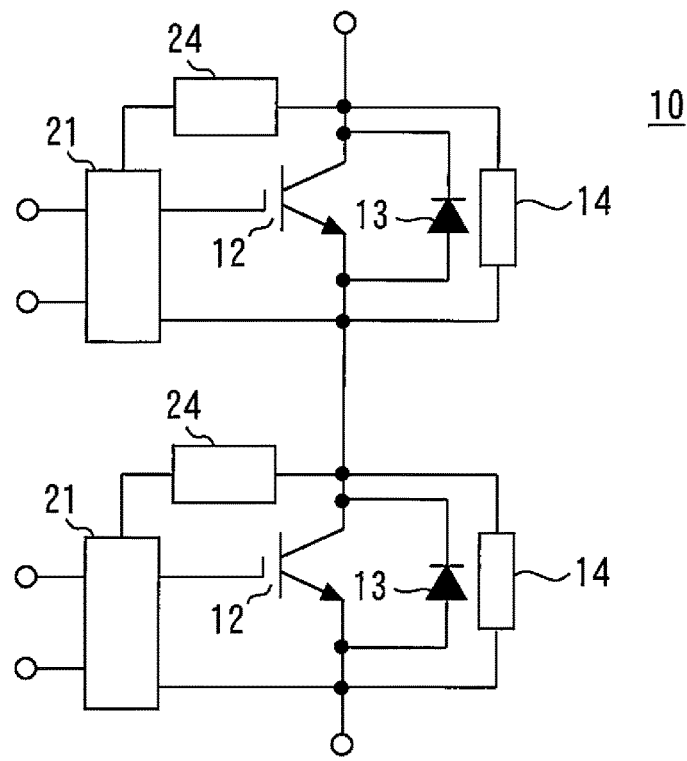
FIG. 3 is a diagram showing a semiconductor device according to Embodiment 1 of the present invention.

FIGS. 1 to 5 are diagrams showing a semiconductor device 1 according to Embodiment 1 of the present invention. FIG. 1 shows an example of a case where the semiconductor device 1 is a three-phase inverter. A leg 2 shown in FIG. 2 is formed of an upper arm and a lower arm connected in series, and corresponds to one leg of an inverter circuit. FIG. 3 shows an arm 10 applicable to the upper or lower arm. In the semiconductor device 1, each leg 2 shown in FIG. 2 is formed by using a pair of the arms 10 shown in FIG. 3, and an inverter circuit having three phases U, V and W is formed by connecting three legs 2 in parallel with each other, as shown in FIG. 1. As shown in FIG. 1, one end of each leg 2 is connected to a P bus, the other end of the leg 2 is connected to an N bus, and a power supply Ed is connected to the P bus and the N bus. An output Out of each leg 2 is supplied to a motor 3 existing as a load.

The arm 10 shown in FIG. 3 includes gate control units 21, clamp circuits 24, self-arc-extinguishing elements 12 each having a gate as a control terminal, having an emitter and a collector as main electrode terminals and having a static withstand voltage Va, reflux diodes 13 connected between the main electrode terminals of the self-arc-extinguishing elements 12 in parallel and reversely to the same, and balance elements 14 for balancing divided voltages with respect to the static withstand voltage. The arm 10 has two self-arc-extinguishing elements 12 connected in series. The balance elements 14 are, for example, resistors or snubber capacitors. The self-arc-extinguishing elements 12 are assumed to be IGBTs in Embodiment 1. The self-arc-extinguishing elements 12 may alternatively be MOSFETs or bipolar transistors. The arm 10 shown in FIG. 3 may be provided as one semiconductor module. The present invention is not limited to the configuration of the arm 10 in which two self-arc-extinguishing elements 12 are connected in series. If n is an integer equal to or larger than 3, n number of self-arc-extinguishing elements 12 may be connected in series to form one arm.

Figure 4:
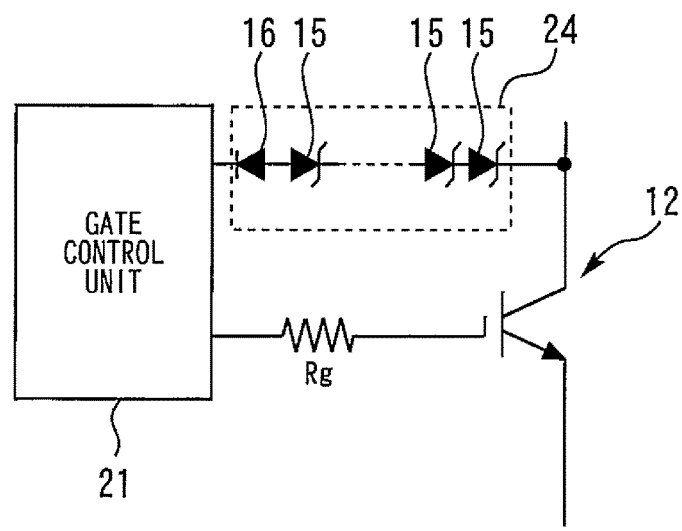
FIG. 4 is a diagram showing a semiconductor device according to Embodiment 1 of the present invention.

FIG. 4 is a circuit diagram of the clamp circuit 24. The clamp circuit 24 is connected between the collector and the gate of the self-arc-extinguishing element 12. The clamp circuit 24 is formed by connecting a plurality of Zener diodes 15 in series, with the anodes and cathodes uniformly directed. A clamp voltage setpoint Vclp of the clamp circuit 24 is adjustable. The cathode of the Zener diode 15 at an outermost end in the series circuit of the plurality of Zener diodes 15 is connected to the collector of the self-arc-extinguishing element 12, while the anode of the Zener diode 15 at the other end is connected to the gate control unit 21 through a rectifier diode 16. Reverse flow of a current from the gate control unit 21 side can be prevented by connecting the rectifier diode 16 with reverse polarity in series with the Zener diode 15. The clamp voltage setpoint Vclp adjusted with the Zener diodes 15 is set to 70% or less of the static withstand voltage. It is preferable that the clamp voltage setpoint Vclp be equal to or higher than 50% of the static withstand voltage. The clamp circuit 24 is inserted between the gate and the collector for the purpose of inhibiting, at the time of turnoff switching, unbalance of voltages across the plurality of self-arc-extinguishing elements 12 connected in series. By inserting the clamp circuit 24, the clamp voltage setpoint Vclp is set so low that clamping is performed with reliability.

Figure 5:
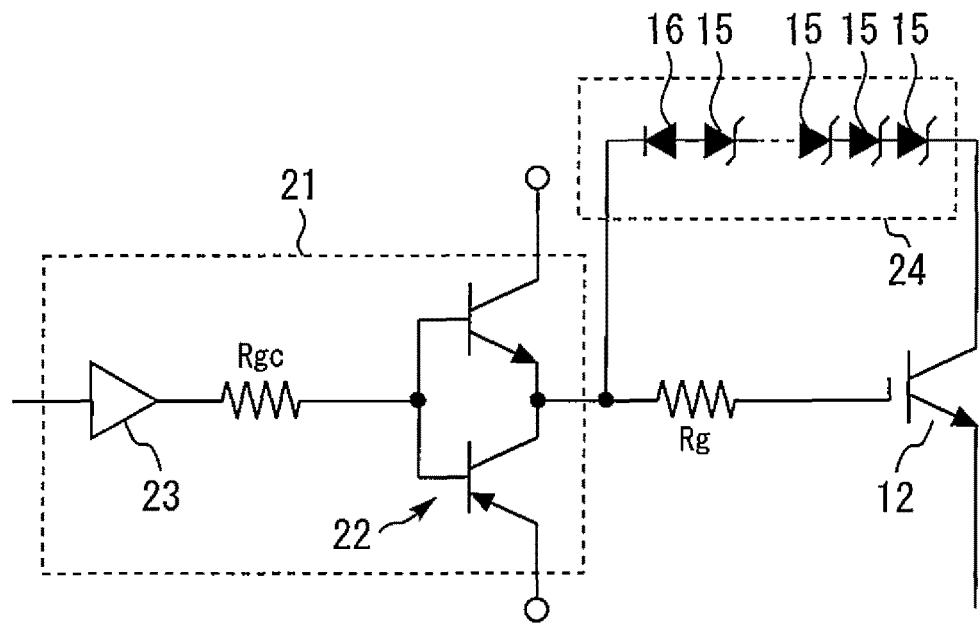
FIG. 5 is a diagram showing a semiconductor device according to Embodiment 1 of the present invention.
Figure 6:
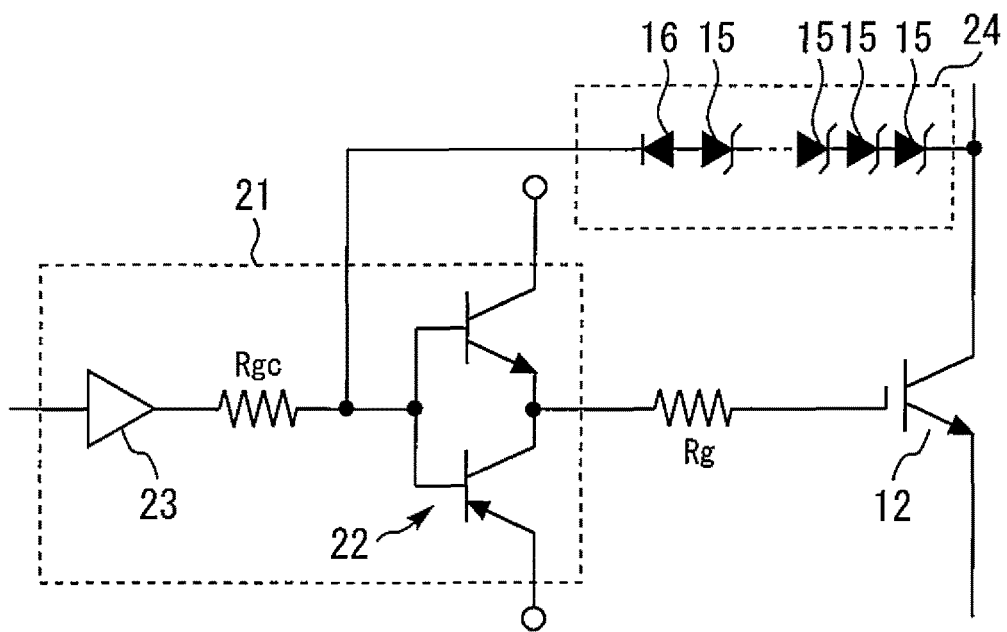
FIG. 6 is a diagram showing a semiconductor device according to a modified example of Embodiment 1 of the present invention.

FIG. 5 shows an example of the circuit in the gate control unit 21 shown in FIG. 4, and a point of connection of the clamp circuit 24. The gate control unit 21 has a push-pull circuit 22 connected to the control terminal of the self-arc-extinguishing element 12, an inverter element 23 which receives an input signal, and a resistor Rgc inserted between the push-pull circuit 22 and the inverter element 23. Referring to FIG. 5, one end of the clamp circuit 24 shown in FIG. 4 is connected to a point of connection between the gate resistor Rg and the push-pull circuit 22. FIG. 6 is a diagram showing a semiconductor device 1 according to a modified example of Embodiment 1 of the present invention. One end of the clamp circuit 24 may be connected to a point in front of the push-pull circuit 22 in the gate control unit 21.

Figure 7:
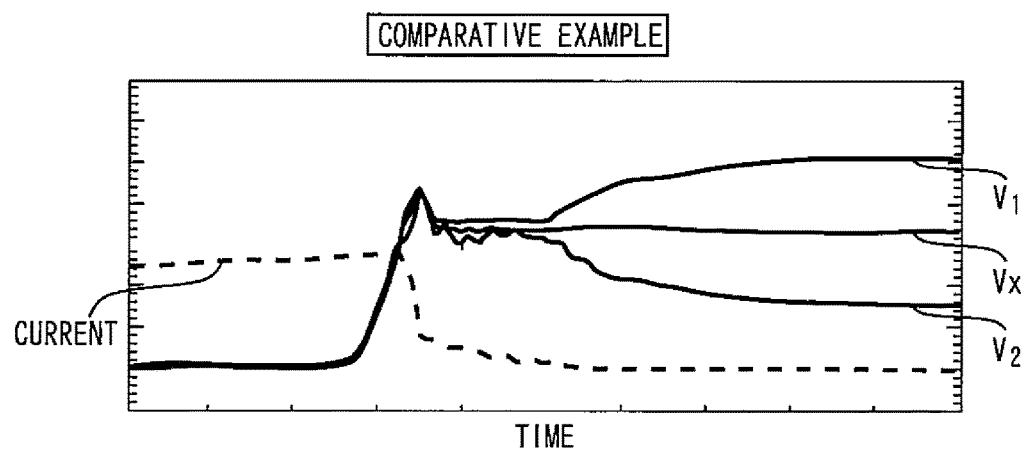
FIG. 7 is a diagram relating to a comparative example referred to for explanation of the advantage of the embodiment.

FIG. 7 is a diagram relating to a comparative example referred to for explanation of the advantage of the embodiment. FIG. 7 shows turnoff waveforms of two self-arc-extinguishing elements 12 connected in series in a case where the clamp circuit 24 according to the present embodiment is not provided. The difference between collector-emitter voltages V1 and V2 of the two self-arc-extinguishing elements 12 connected in series is increased (in a steady state) after the completion of turn off.

Figure 8:
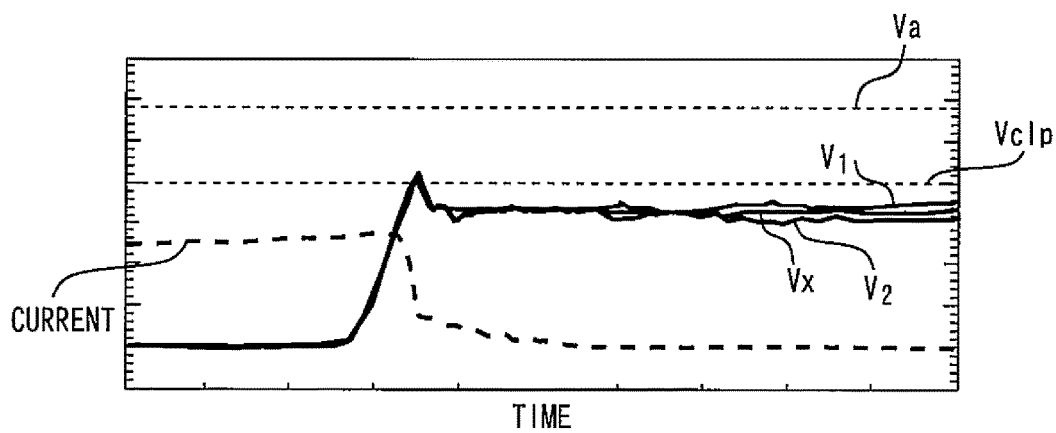
FIG. 8 is a diagram of operating waveforms in the semiconductor device according to Embodiment 1 of the present invention.

FIG. 8 is a diagram of operating waveforms in the semiconductor device 1 according to Embodiment 1 of the present invention. FIG. 8 shows the waveforms of current I and voltages V1 and V2 when the two self-arc-extinguishing elements 12 that the arm 10 of the semiconductor device 1 has are turned off. A voltage Vx is the average of the voltage V1 and the voltage V2. The static withstand voltage Va and the clamp voltage setpoint Vclp are also shown in the diagram. The voltage V1 is the collector-emitter voltage of one of the two self-arc-extinguishing elements 12, and the voltage V2 is the collector-emitter voltage of the other self-arc-extinguishing element 12. After the completion of turnoff, that is, in a steady state, the collector-emitter voltages V1 and V2 of the two self-arc-extinguishing elements 12 are brought closer to a uniform magnitude. Thus, the semiconductor device 1 with high reliability can be provided. Detailed description will be made of this point. In a case where switching of two self-arc-extinguishing elements 12 connected in series is performed, a surge voltage is generated due to a reduction in current at the time of turnoff switching, and the surge voltage reaches the clamp voltage setpoint Vclp. After the clamp voltage setpoint Vclp is reached, the rates of reduction in current in the two self-arc-extinguishing elements 12 connected in series are made constant until the current becomes zero, and the impedances of the two self-arc-extinguishing elements 12 connected in series are apparently in a balanced state. Thus, the collector-emitter voltages are intentionally clamped at a level sufficiently lower than the static withstand voltage to make constant the rates of reduction in current in a plurality of self-arc-extinguishing elements 12 connected in series, enabling inhibition of unbalance between the voltages V1 and the voltage V2 at the time of turnoff and immediately after turnoff.

If the clamp voltage setpoint Vclp is excessively high, the clamp circuit 24 does not operate as intended at the time of ordinary turnoff. It is thought that the clamp voltage setpoint Vclp determined on the assumption that the conventional overvoltage protection is performed is the same as the static withstand voltage, i.e., 100% of the static withstand voltage, or as high as about 80 to 90% of the static withstand voltage. If such a clamp voltage setpoint Vclp is selected, the clamp circuit operates only at the time of generation of an overvoltage, as intended with respect to the conventional overvoltage protection circuit. In the present embodiment, therefore, the clamp voltage setpoint Vclp is set to 70% or less of the static withstand voltage. The clamp circuit 24 is thereby enabled to operate at the time of ordinary turnoff. On the other hand, if the clamp voltage setpoint Vclp is excessively low, a high load is imposed on the clamp circuit 24, which is undesirable. It is, therefore, preferable to set the clamp voltage setpoint Vclp to 50% or more of the static withstand voltage.

Figure 9:
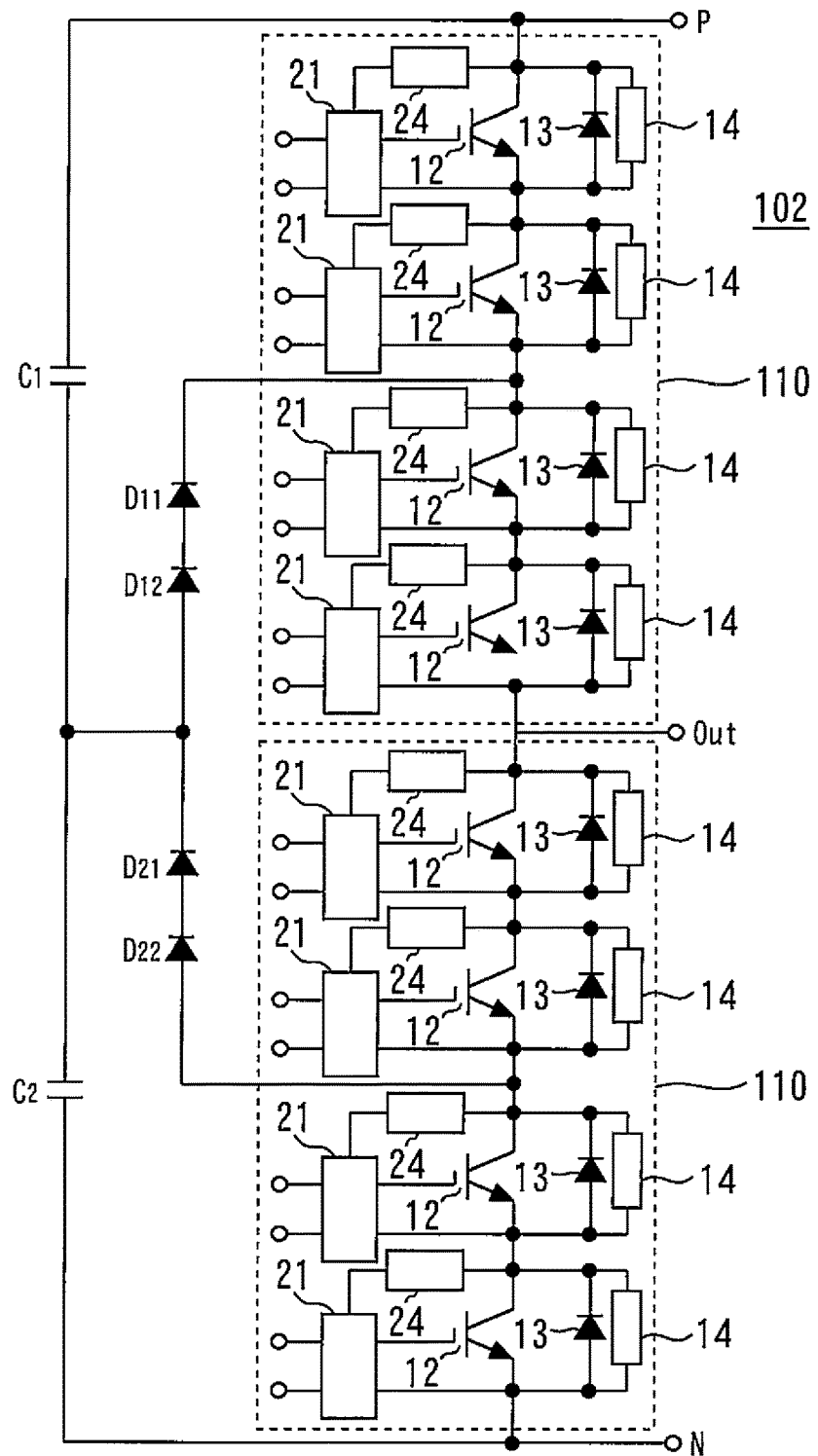
FIG. 9 is a diagram showing semiconductor devices according to modified examples of Embodiment 1 of the present invention.
Figure 10:
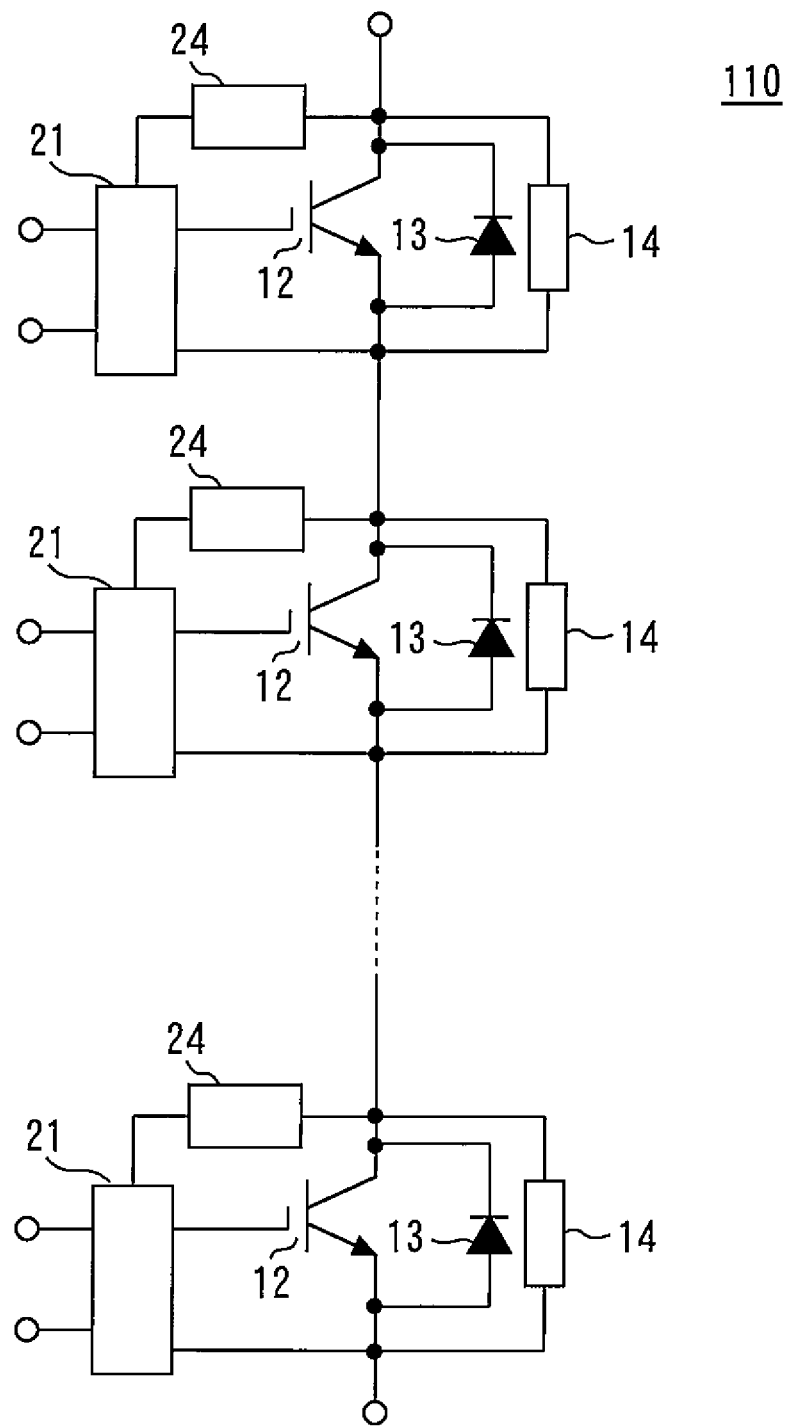
FIG. 10 is a diagram showing semiconductor devices according to modified examples of Embodiment 1 of the present invention.

FIGS. 9 to 12 are diagrams showing semiconductor devices 1 according to modified examples of Embodiment 1 of the present invention. A leg 102 in FIG. 9 is a modified example of the leg 2 shown in FIG. 2, such that eight self-arc-extinguishing elements 12 are connected in series in one leg. As shown in FIG. 9, the leg 102 further includes diodes D11, D12, D21, D22, and capacitors C1 and C2. FIG. 10 is a circuit diagram showing arms 110 included in the leg 102 shown in FIG. 9. A concrete circuit arrangement for a three-level inverter or a multilevel inverter such as shown in FIG. 2 or 9 is already known well and is not a new matter and, therefore, will not be described. The semiconductor device 1 can be modified, for example, into a two-level inverter, three-level inverter or a multilevel inverter having four or more levels. A suitable number of phases, e.g., a single phase or a three phases may also be determined according to one's need.

Figure 11:
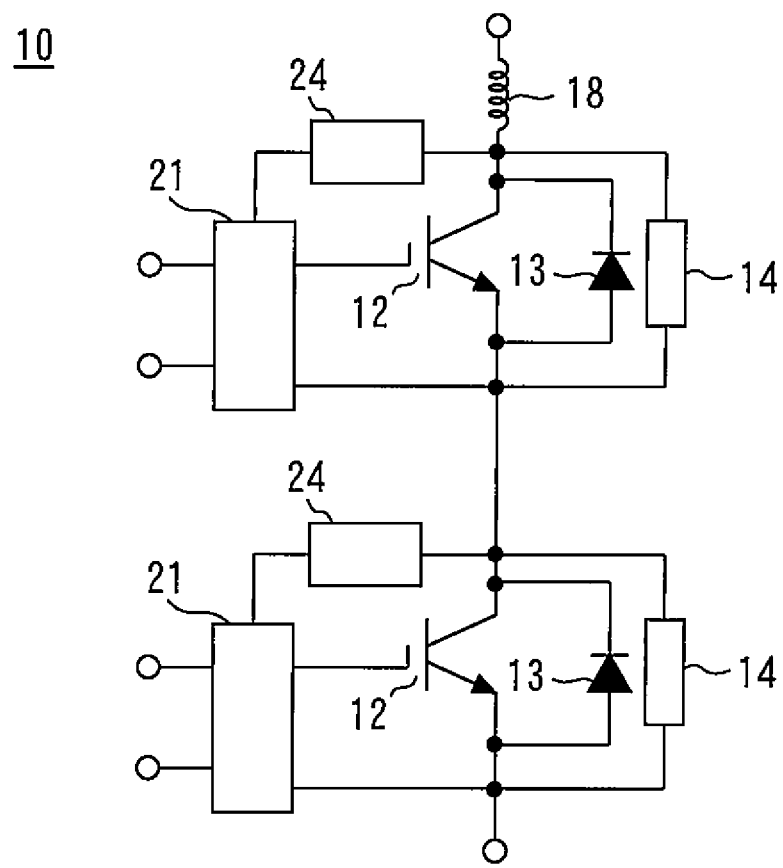
FIG. 11 is a diagram showing semiconductor devices according to modified examples of Embodiment 1 of the present invention.

In the modified example shown in FIG. 11, an inductance 18 is connected between the arm 10 and the P bus. In a case where a switching operation is performed with the circuit formed as shown in FIG. 11, a surge voltage generated at the time of turnoff switching is increased in comparison with that shown in FIG. 8, because the inductance 18 increases the circuit inductance. It is preferable to increase the circuit inductance, for example, to about 200 nH to several microhenries. If the circuit inductance 18 is increased, a surge voltage equal to or higher than the clamp voltage setpoint Vclp can easily be generated. Reaching to the clamp voltage setpoint Vclp is therefore facilitated to enable the clamp circuit 24 to operate with stability.

Figure 12:
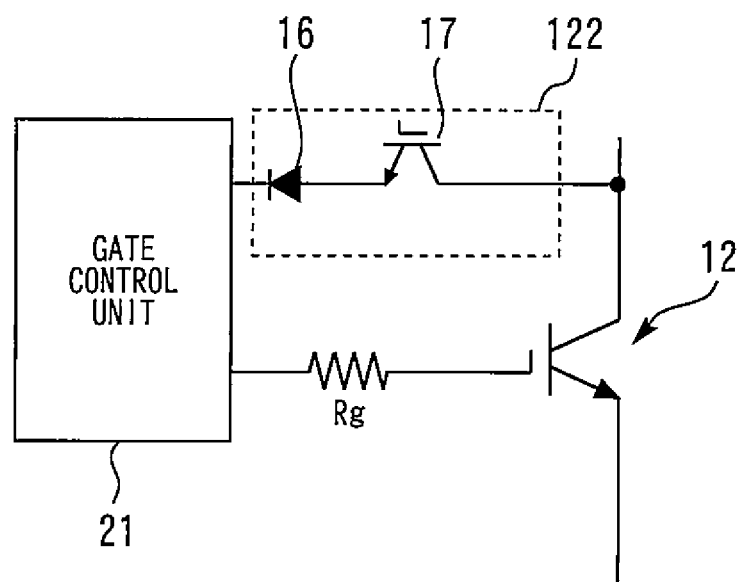
FIG. 12 is a diagram showing semiconductor devices according to modified examples of Embodiment 1 of the present invention.

FIG. 12 shows a clamp circuit 122 as a modified example. The clamp circuit 122 is connected between the collector and the gate of the self-arc-extinguishing element 12, as is the clamp circuit 24. The clamp circuit 122 is formed by connecting in series a self-arc-extinguishing element 17 having a self-clamping function and a rectifier diode 16 for prevention of reverse current from the gate control unit 21. While the self-arc-extinguishing element 17 is an IGBT in the modified example shown in FIG. 12, the self-arc-extinguishing element 17 may alternatively be a MOSFET or a bipolar transistor. The collector of the self-arc-extinguishing element 17 is connected to the collector of the self-arc-extinguishing element 12, and the emitter of the self-arc-extinguishing element 17 is connected to the anode of the rectifier diode 16. The self-arc-extinguishing element 17 performs self-clamping at a voltage of 60 to 70% of the static withstand voltage of the self-arc-extinguishing element 12. The self-arc-extinguishing element 17 having self-clamping ability has a static withstand voltage of, for example, 1.7 kV to 10 kV.

Embodiment 2

Figure 13:
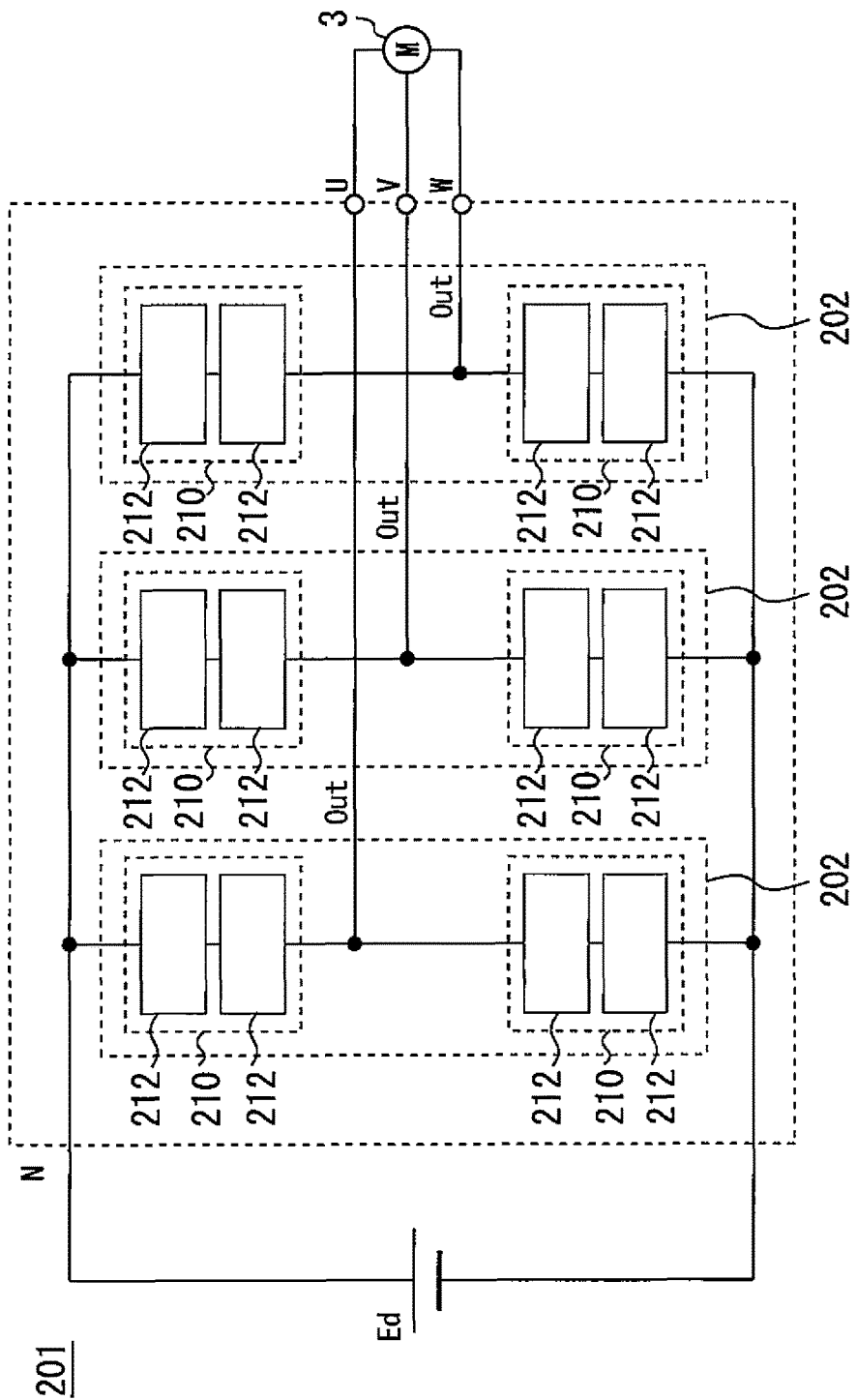
FIG. 13 is a diagram showing a semiconductor device according to Embodiment 2 of the present invention.
Figure 14:
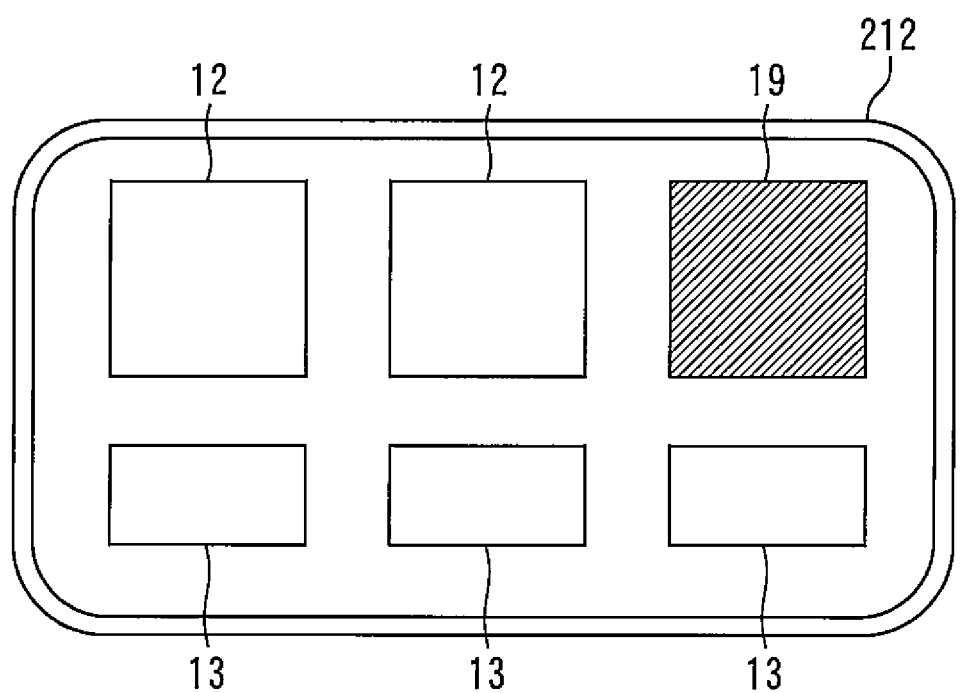
FIG. 14 is a diagram showing a semiconductor device according to Embodiment 2 of the present invention.
Figure 15:
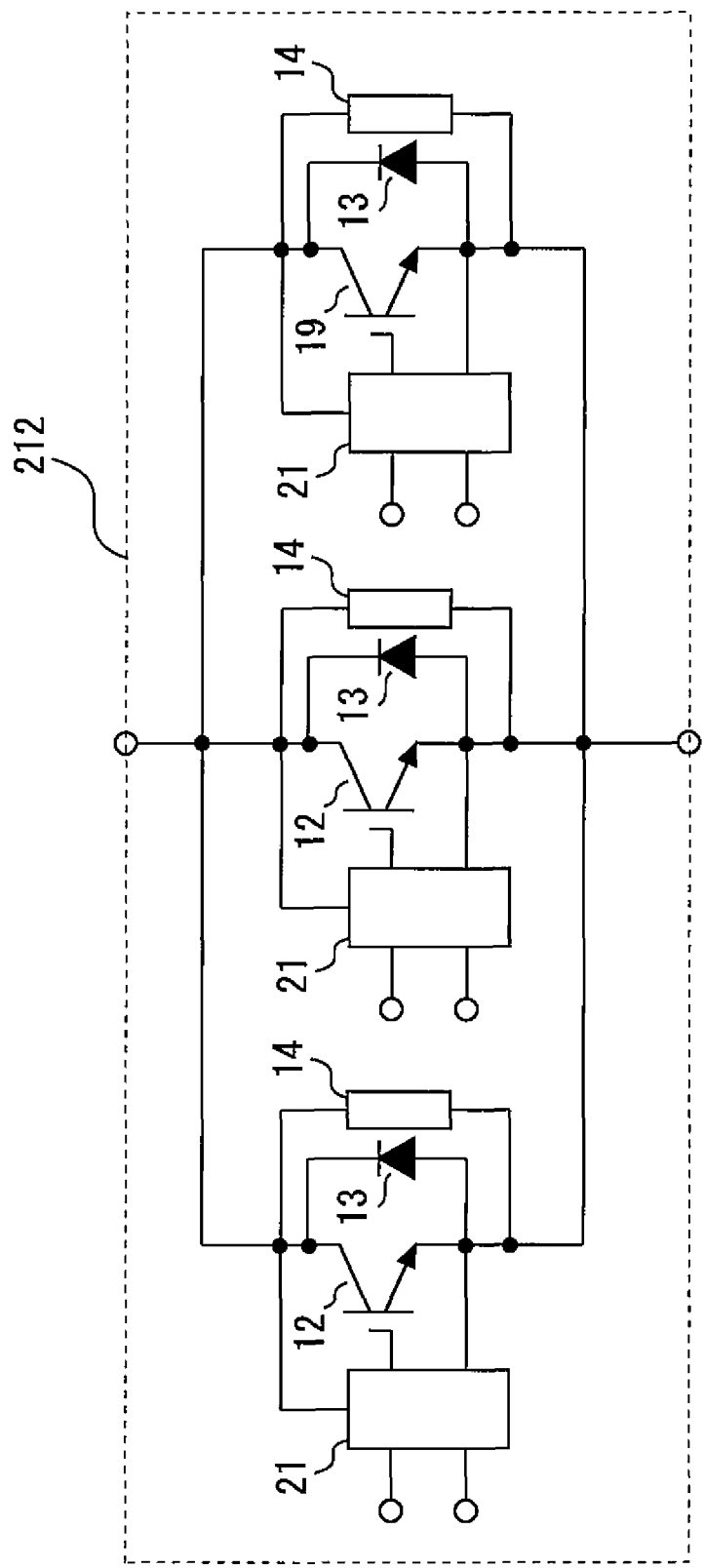
FIG. 15 is a diagram showing a semiconductor device according to Embodiment 2 of the present invention.

FIGS. 13 to 15 are diagrams showing a semiconductor device 201 according to Embodiment 2 of the present invention. FIG. 13 is an overall circuit diagram of the semiconductor device 201. FIG. 14 is a top view schematically showing the internal structure of a semiconductor module 212 provided in the semiconductor device 201. FIG. 15 is a circuit diagram of the semiconductor module 212. The semiconductor module 212 has a plurality of self-arc-extinguishing elements 12 connected in parallel with each other and a plurality of reflux diodes 13 connected in parallel with each other. The self-arc-extinguishing elements 12 and the reflux diodes 13 are connected in parallel and reversely to each other.

A self-arc-extinguishing element 19 having a self-clamping function is connected in parallel with the self-arc-extinguishing elements 12. The self-arc-extinguishing element 19 is, for example, an IGBT or a MOSFET. In the semiconductor module 212 according to Embodiment 2, each self-arc-extinguishing element 12 is not provided with the clamp circuit 24 according to Embodiment 1.

The voltage at which the self-arc-extinguishing element 19 performs the self-clamping function is assumed to be the same as the clamp voltage setpoint Vclp of the clamp circuits including the clamp circuit 24 in Embodiment 1 or the like. For example, the static withstand voltage of the self-arc-extinguishing element 19 is preferably 70% or less of the static withstand voltage of the self-arc-extinguishing elements 12 and the reflux diodes 13, more preferably 50% or more of the static withstand voltage of the self-arc-extinguishing elements 12 and the reflux diodes 13. In the present embodiment, the self-arc-extinguishing element 19 performs the self-clamping function when the emitter-collector voltage of the self-arc-extinguishing element 19 is about 50 to 70% of the self-arc-extinguishing elements 12 or the like. The on-resistance of the self-arc-extinguishing element 19 is set higher than that of the self-arc-extinguishing elements 12, thereby enabling causing currents to flow with priority through the self-arc-extinguishing elements 12 in the self-arc-extinguishing elements 12 and 19 connected in parallel with each other.

As shown in FIG. 13, the semiconductor device 201 according to Embodiment 2 has the semiconductor modules 212 respectively substituted for the self-arc-extinguishing elements 12 shown in FIG. 1 in the semiconductor device 1 in Embodiment 1. Accordingly, in Embodiment 2, one arm 210 is formed by connecting two semiconductor modules 212 in series; two arms 210 thus formed are connected in series to form one leg 202; and a plurality of legs 202 thus formed are connected in parallel with each other to form an inverter circuit. Since three self-arc-extinguishing elements are included in one semiconductor module 212, a total of six self-arc-extinguishing elements are included in one arm 210 in Embodiment 2. The present invention is not limited to this. The number of self-arc-extinguishing elements 12 connected in parallel with each other in one semiconductor module 212 may be three or more. Also, three or more semiconductor modules 212 may be connected in series to form one arm.

In the semiconductor module 212, a surge voltage generated at the time of turnoff switching is limited by the self-arc-extinguishing element 19 and thus clamped. Therefore the rates of reduction in current in the plurality of self-arc-extinguishing elements 12 and 19 connected in series are made constant until the current becomes zero, and the impedances of the plurality of self-arc-extinguishing elements 12 and 19 connected in series are apparently in a balanced state. The effect of inhibiting voltage unbalance at the time of turnoff and immediately after turnoff is thus obtained. In the present embodiment, as described above, the collector-emitter voltages are intentionally clamped at a level sufficiently lower than the static withstand voltage to make constant the rates of reduction in current in the self-arc-extinguishing elements 12 and 19 included in the plurality of semiconductor module 212 connected in series, enabling inhibition of voltage unbalance at the time of turnoff and immediately after turnoff.

Preferably, having self-clamping ability is an SiC device. More specifically, it is preferable that the self-arc-extinguishing element 19 be, for example, a MOSFET made of SiC. The self-arc-extinguishing element 19 may be replaced with a Schottky barrier diode made of SiC. The clamp resistance can thereby be improved to achieve a further improvement in reliability.

REFERENCE SIGNS LIST 1, 201 semiconductor device
2, 102, 202 leg 10, 110, 210 arm
12, 17, 19 self-arc-extinguishing element
13 reflux diode
14 balance element
15 Zener diode
16 rectifier diode
18 inductance
21 gate control unit
22 push-pull circuit
23 inverter element
24 clamp circuit
122 clamp circuit
212 semiconductor module

The invention claimed is:

1. A semiconductor device comprising:
a plurality of first self-arc-extinguishing elements having a control terminal and a plurality of main electrode terminals, the first self-arc-extinguishing elements being connected in series with each other; and
clamp means connected to the plurality of first self-arc-extinguishing elements, the clamp means clamping, at the time of turnoff of one of the first self-arc-extinguishing elements, the voltage between the main electrode terminals of the first self-arc-extinguishing element at a clamp voltage set equal to or lower than 70% of a static withstand voltage that the first self-arc-extinguishing element has, wherein
the clamp means includes a clamping self-arc-extinguishing element having a first terminal, a second terminal and a third terminal for switching between the first and second terminals, the clamping self-arc-extinguishing element being connected between one of the main electrode terminals and the control terminal, the first terminal being connected at the one of the main electrode terminals side, the second terminal being connected at the control terminal side, and
a voltage at which the clamping self-arc-extinguishing element clamps itself is 50 to 70% of the static withstand voltage of the first self-arc-extinguishing element.

2. A semiconductor device comprising:
a plurality of first self-arc-extinguishing elements having a control terminal and a plurality of main electrode terminals, the first self-arc-extinguishing elements being connected in series with each other; and
clamp means connected to the plurality of first self-arc-extinguishing elements, the clamp means clamping, at the time of turnoff of one of the first self-arc-extinguishing elements, the voltage between the main electrode terminals of the first self-arc-extinguishing element at a clamp voltage set equal to or lower than 70% of a static withstand voltage that the first self-arc-extinguishing element has, wherein
the clamp means includes a second self-arc-extinguishing element connected in parallel with the first self-arc-extinguishing element and having a self-clamping function, and
the second self-arc-extinguishing element performs the clamping function at a clamp voltage set equal to or lower than 70% of the static withstand voltage that the first self-arc-extinguishing element has, and
the second self-arc-extinguishing element has an on-resistance higher than that of the first self-arc-extinguishing element.

3. The semiconductor device according to claim 2, wherein the second self-arc-extinguishing element is an SiC semiconductor element.

4. The semiconductor device according to claim 2, wherein two or more of the plurality of first self-arc-extinguishing elements constitute a first arm, other two or more of the plurality of first self-arc-extinguishing elements constitute a second arm, and the first arm and the second arm are connected in series with each other to constitute one leg, and
wherein the clamp means is provided on the first self-arc-extinguishing elements of the first arm and the second arm, the semiconductor device further comprising an inverter circuit in which a plurality of the legs are connected in parallel with each other.

5. A semiconductor device comprising:
a plurality of first self-arc-extinguishing elements having a control terminal and a plurality of main electrode terminals, the first self-arc-extinguishing elements being connected in series with each other; and
clamp means connected to the plurality of first self-arc-extinguishing elements, the clamp means clamping, at the time of turnoff of one of the first self-arc-extinguishing elements, the voltage between the main electrode terminals of the first self-arc-extinguishing element at a clamp voltage set equal to or lower than 70% of a static withstand voltage that the first self-arc-extinguishing element has, wherein
the clamp means includes a Schottky barrier diode connected in parallel with the first self-arc-extinguishing element and having a self-clamping function, and
the Schottky barrier diode performs the clamping function at a clamp voltage set equal to or lower than 70% of the static withstand voltage that the first self-arc-extinguishing element has, and
the Schottky barrier diode has an on-resistance higher than that of the first self-arc-extinguishing element.

6. The semiconductor device according to claim 5, wherein two or more of the plurality of first self-arc-extinguishing elements constitute a first arm, other two or more of the plurality of first self-arc-extinguishing elements constitute a second arm, and the first arm and the second arm are connected in series with each other to constitute one leg, and
wherein the clamp means is provided on the first self-arc-extinguishing elements of the first arm and the second arm, the semiconductor device further comprising an inverter circuit in which a plurality of the legs are connected in parallel with each other.

7. The semiconductor device according to claim 1, wherein two or more of the plurality of first self-arc-extinguishing elements constitute a first arm, other two or more of the plurality of first self-arc-extinguishing elements constitute a second arm, and the first arm and the second arm are connected in series with each other to constitute one leg, and
wherein the clamp means is provided on the first self-arc-extinguishing elements of the first arm and the second arm, the semiconductor device further comprising an inverter circuit in which a plurality of the legs are connected in parallel with each other.

* * * * *